United States Patent [19]

Fullerton

[11] Patent Number: 4,914,728
[45] Date of Patent: Apr. 3, 1990

[54] WIDEBAND MMIC ACTIVE QUADRATURE HYBRID

[75] Inventor: Craig L. Fullerton, Scottsdale, Ariz.
[73] Assignee: Motorola, Inc., Schaumburg, Ill.
[21] Appl. No.: 327,676
[22] Filed: Mar. 23, 1989
[51] Int. Cl.⁴ .......................................... H03H 11/22
[52] U.S. Cl. .................................. 333/118; 330/126; 330/277; 333/112
[58] Field of Search ............... 333/109, 110, 112, 117, 333/118; 330/126

[56] References Cited

U.S. PATENT DOCUMENTS 3,295,134 12/1966 Lowe .............................. 333/109 X
4,673,898 6/1987 Redmond ............................ 333/109

Primary Examiner—Paul Gensler
Attorney, Agent, or Firm—Jordan C. Powell

[57] ABSTRACT

A wideband active quadrature 90 degree hybrid for increased bandwidths with low power losses and the capability to have gain. The 90 degree hybrid can be incorporated in small areas for MMIC (monolithic microwave integrated circuits) circuitry in the low microwave frequencies. The 90 degree hybrid comprises a plurality of 90 degree phase shift means, each preceded by an input amplifier. Each of the 90 degree differential phase shift means comprises a high pass and a low pass filter. The low pass filter outputs are added together and amplified. The high pass filter outputs are also added together and amplified. The resultant amplified signals are output with a phase differential of 90 degrees. The amplifiers supply gain which is lost in the 90 degree phase shifting.

10 Claims, 2 Drawing Sheets

WIDEBAND MMIC ACTIVE QUADRATURE HYBRID

BACKGROUND OF THE INVENTION

This invention relates, in general, to 90 degree hybrids, and more specifically, to quadrature hybrids.

Major components in many microwave systems are hybrids. Hybrids and couplers used in MMIC (monolithic microwave integrated circuit) designs generally require quarter wave distributed elements that are too large for frequencies below 10 Ghz. Branch line hybrids can be simulated using lumped elements instead of quarter wave distributed elements, but the simulated hybrids are subject to substantial losses, and operate within a narrow bandwidth ($\approx 5\%$). Furthermore, the lumped elements get large as the frequency of operation decreases. Therefore, conventional MMIC circuits require off chip 90 degree hybrid functions.

SUMMARY OF THE INVENTION

Accordingly, it is an object of the present invention to provide a 90 degree hybrid with a wide bandwidth.

Another object of the present invention is to provide a 90 degree hybrid which can be incorporated in small areas for use in MMIC applications and low microwave frequencies.

A further object of the present invention is to provide a MMIC 90 degree hybrid with low power losses and the capability to have gain.

A wideband active quadrature hybrid accomplishes the above objects of the present invention. The hybrid incorporates a plurality of 90 degree differential phase shift means, each preceded by an input amplifier. Each of the 90 degree differential phase shift means comprises a high pass and a low pass filter. The low pass filter outputs are added together and amplified. The high pass filter outputs are also added together and amplified. The resultant amplified signals are output with a phase differential of 90 degrees.

The above and other objects, features, and advantages of the present invention will be better understood from the following detailed description taken in conjunction with the accompanying drawings.

DETAILED DESCRIPTION OF THE INVENTION

Figure 1:
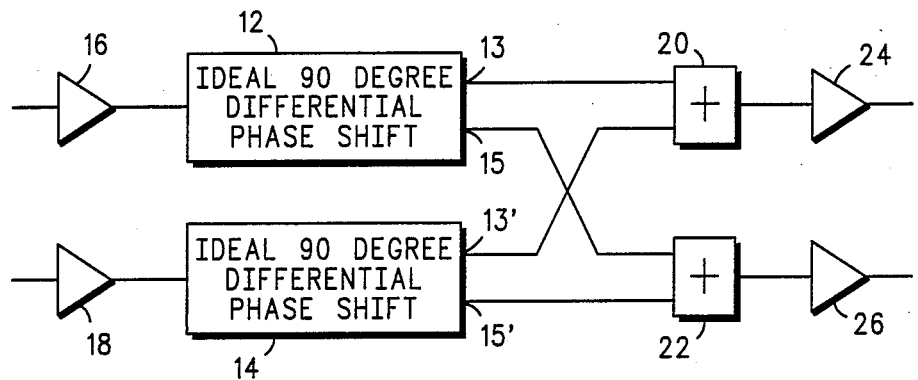
FIG. 1 is a schematic diagram of a wideband MMIC active quadrature hybrid according to the present invention.

An active quadrature hybrid 10 for use in MMIC (monolithic microwave intergrated circuits) design is shown in FIG. 1 in its preferred embodiment. As shown, hybrid 10 is broken into ideal 90 degree differential phase shifts 12 and 14, input amplifiers 16 and 18, adders 20 and 22, and output amplifiers 24 and 26. Ideal 90 degree differential phase shifts 12 and 14 comprise first outputs 13 and 13', and second output terminals 15 and 15', respectively.

Input amplifier 16 is coupled to ideal 90 degree differential phase shift 12. Input amplifier 18 is coupled to ideal 90 degree differential phase shift 14. First output terminals 13 and 13' of ideal 90 degree differential phase shifts 12 and 14 are coupled to adder 20. Second output terminals 15 and 15' are coupled to adder 22. Adders 20 and 22 are coupled to output amplifiers 24 and 26 respectively.

Input amplifiers 16 and 18, and output amplifiers 24 and 26 replace gain lost in the phase shifting process of ideal 90 degree differential phase shifts 12 and 14.

Hybrid 10 outputs a plurality of signals 90 degrees out of phase with each other when parallel signals equal in phase and amplitude are received by input amplifiers 16 and 18. Hybrid 10 also outputs a plurality of signals 90 degrees out of phase when one signal is received by either input amplifier 16 or 18. When parallel signals equal in phase and amplitude are received by input amplifiers 16 and 18 the respective signals are amplified by input amplifiers 16 and 18. The amplified signals are output to ideal 90 degree differential phase shifts 12 and 14 respectively. For instance, a signal, having a phase of $\phi$ and an amplitude A received by input amplifier 16 is amplified and relayed to ideal 90 degree differential phase shift 12 where it is split and shifted in phase. The split signals are then output at output terminals 13 and 15. The output signals of terminals 13 and 15 have a phase of $(\phi+45°)$ and $(\phi-45°)$ respectively, and an amplitude of A/2. Similarly, a signal having amplitude B and phase $\phi$ received from input amplifier 18 is output at output terminals 13' and 15' of ideal 90 degree differential phase shift 14. These output signals have amplitudes of B/2, and phases of $(\phi+45°)$ and $(\phi-45°)$ respectively. Outputs from output terminals 13 and 13' are combined by adder 20 yielding a signal of amplitude $(A+B)/2$ and phase $(\phi+45°)$. Outputs from output terminals 15 and 15' are combined by adder 22 yielding a signal of amplitude $(A+B)/2$ and phase $(\phi-45°)$. The phase difference of the signals in adders 20 and 22 is $((\phi+45°)-(\phi-45°))=90$ degrees. The combined signals from adders 20 and 22 are then amplified in output amplifiers 24 and 26 respectively. The amplified signals are output with a phase difference of 90 degrees.

Assuming no signal is received by input amplifier 18, a signal with a magnitude of A and a phase of $\phi$, received by input amplifier 16 is output at output terminals 13 and 15 with magnitudes of A/2. The output signals have phases of $(\phi+45°)$ and $(\phi-45°)$, and are output to adders 20 and 22 respectively. Since no signal was received by input amplifier 18, the amplitude of the signals in adders 20 and 22 is A/2. The phase difference between the signals in adders 20 and 22 is $((\phi+45°)-(\phi-45°))=90$ degrees.

Figure 2:
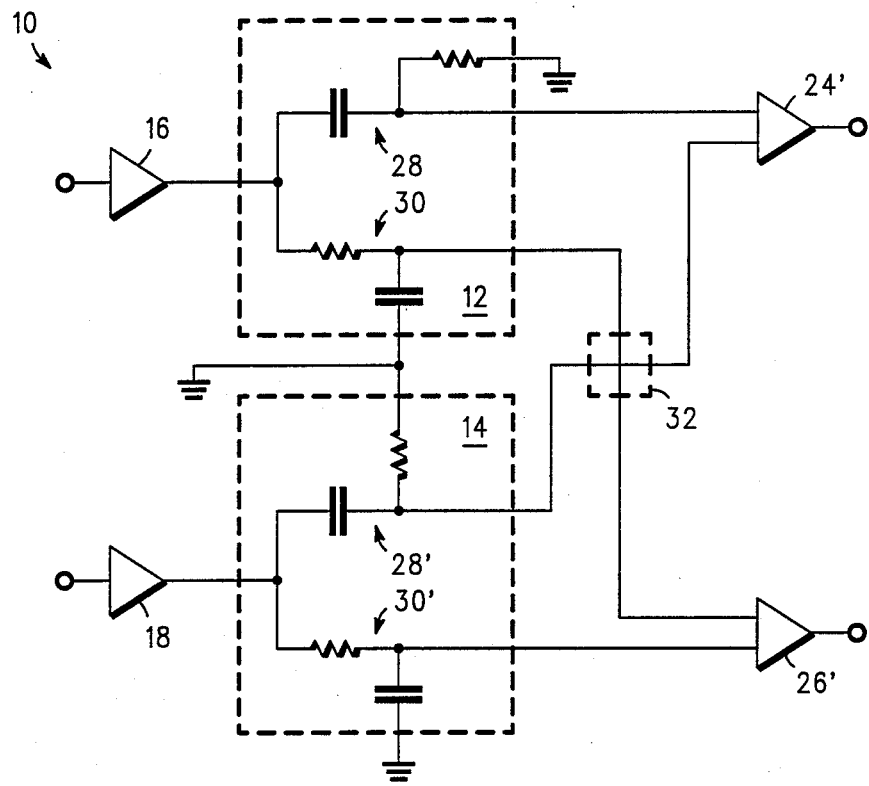
FIG. 2 is a detailed schematic diagram of the wideband MMIC active quadrature hybrid of FIG. 1 according to the present invention.

FIG. 2 shows a more detailed schematic diagram of hybrid 10. Adders 20 and 22 are combined in output amplifiers 24 and 26 to form active combining amplifiers 24' and 26'. Ideal 90 degree differential phase shifts 12 and 14 include high pass filters 28 and 28', and low pass filters 30 and 30', respectively.

Hybrid 10 maintains a constant 90 degree difference in phase for all frequencies, with elements 12 and 14 operating as ideal 90 degree differential phase shifts. This is accomplished by designing components with reactances equal to the output load. Additionally, a capacitive reactance equal to the impedance results in a 7 dB loss at the center frequency (center frequency is the frequency where the reactance equals the real impedance).

High pass filters 28 and 28' and low pass filters 30 and 30' are shown in FIG. 2 as RC filter combinations of resistors and capacitors.

It should be noted that a cross-over 32 of FIG. 2 has the potential of causing mismatching in the impedance of hybrid 10. This is caused by the electric fields of the crossing conductors overlapping each other when they are in the same plane. Therefore, in its preferred embodiment, hybrid 10 may incorporate the coplanar waveguide crossover of U.S. Pat. No. 4,675,620, by the same inventor and issued to the same assignee as the present invention.

Input amplifiers 16 and 18 may be constructed according to the circuit described by Donal B. Estreich in his article *A MONOLITHIC WIDE-BAND GAAS IC AMPLIFIER*, IEEE J. Solid State Circuits, vol. SC-17, pp. 1166–1173, December 1982, which describes an input stage, an intermediate stage, and an output driver. Output amplifiers 24' and 26' may be constructed according to the same described circuit, but must be modified to incorporate adders 20 and 22 of FIG. 1.

Figure 3:
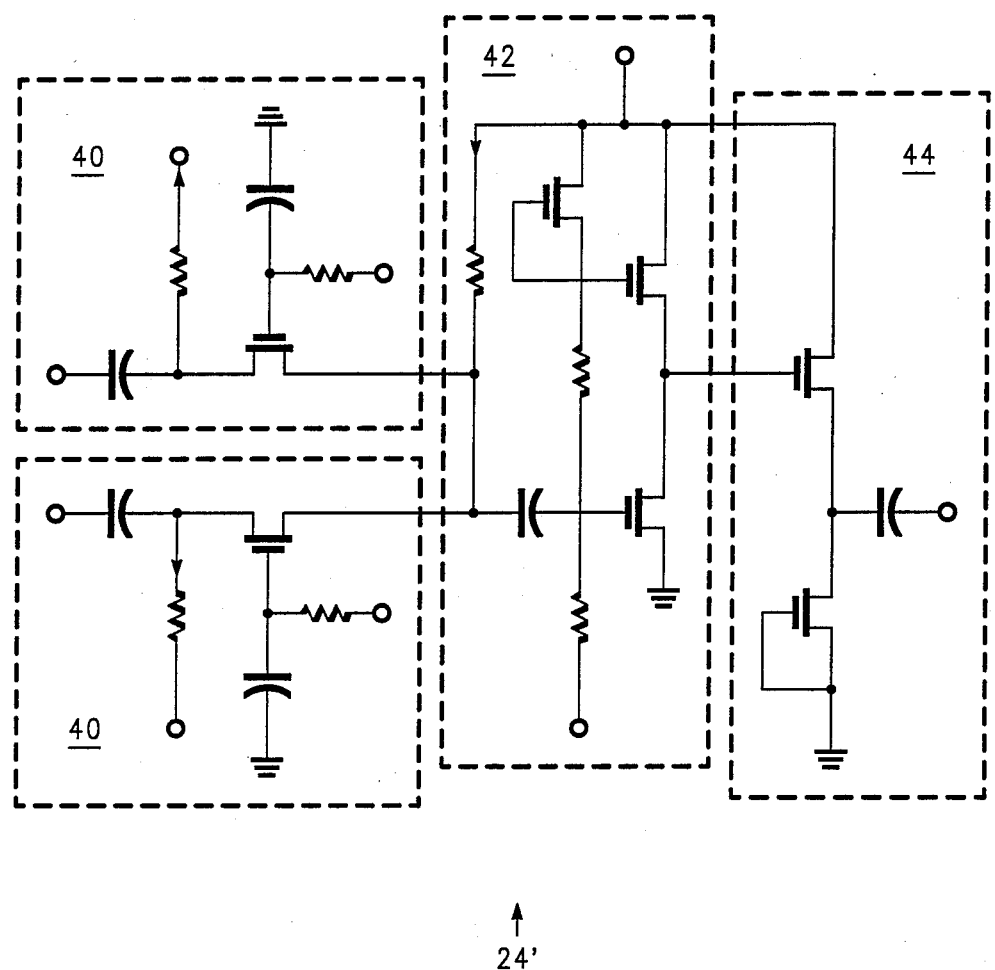
FIG. 3 is a schematic diagram of an output amplifier of the wideband MMIC active quadrature hybrid of FIG. 2 according to the present invention.

FIG. 3 shows output amplifier 24' incorporating an amplifier circuit similar to the circuit described above, but modified to incorporate adders 20 and 22 of FIG. 1. Specifically, output amplifier 24' includes input stages 40, intermediate stage 42, and output driver 44. The make-up of the elements of input stage 40, intermediate stage 42, and output driver 44 may be understood by referencing *A MONOLITHIC WIDE-BAND GAAS IC AMPLIFIER* cited above. By coupling a plurality of input stages 40 in common, output amplifier 24' operates as a combiner and an amplifier. It will be recognized that output amplifier 26' is constructed in the same manner as output amplifier 24'.

Thus there has been provided, in accordance with the present invention, a wideband MMIC quadrature active 90 degree hybrid that fully satisfies the objects, aims, and advantages set forth above. While the invention has been described in conjunction with specific embodiments thereof, it is evident that many alternatives, modifications, and variations will be apparent to those skilled in the art in light of the foregoing description. Accordingly, it is intended to embrace all such alternatives, modifications, and variations as fall within the spirit and broad scope of the appended claims.

I claim:

1. A wideband quadrature hybrid comprising:
   a plurality of 90 degree phase shift means, each of said 90 degree phase shift means receiving a separate input signal;
   each of said plurality of 90 degree phase shift means supplying output signals having a 90 degree phase differential with respect to each other;
   a plurality of output amplifying means;
   each of said plurality of 90 degree phase shift means having a first output coupled to a first of said plurality of output amplifying means to supply a first of said output signals thereto;
   each of said plurality of 90 degree phase shift means having a second output coupled to a second of said plurality of output amplifying means to supply a second of said output signals thereto; and
   said output amplifying means for combining and amplifying said plurality of output signals.

2. A wideband quadrature hybrid according to claim 1 wherein the hybrid further comprises:
   a plurality of input amplifier means for amplifying said input signal, said plurality of input amplifying means supplying said amplified input signal to said plurality of 90 degree phase shift means; and
   one each of said input amplifier means coupled to one each of said plurality of 90 degree phase shift means.

3. A quadrature hybrid according to claim 2 wherein each of said input amplifying means comprises:
   input amplifying stage means;
   intermediate amplifying means;
   output driver means;
   said input amplifying stage means, said intermediate amplifying means, and said output driver means coupled in series; and
   said output driver means coupled to one of said 90 degree phase shift means.

4. A quadrature hybrid according to claim 1 wherein said output amplifying means comprises:
   a plurality of input amplifying stage means for amplifying said output signals from said plurality of 90 degree phase shift means;
   a first of said plurality of input amplifying means coupled to said first output of each of said plurality of 90 degree phase shift means to receive said first output;
   a second of said plurality of input amplifying means coupled to said second output of each of said plurality of 90 degree phase shift means to receive said second output;
   each of said plurality of input amplifying stage means combining its received said output signals;
   a plurality of intermediate amplifying stage means;
   one each of said intermediate amplifying stage means coupled to said one each of said input amplifying stage means to receive said amplified, combined output therefrom;
   said intermediate amplifying stage means for amplifying said amplified, combined outputs;
   a plurality of output driver means, one each of said output driver means coupled to one each of said intermediate amplifying stage means to receive an amplified output therefrom:
   said plurality of output driver means for amplifying said outputs from said plurality of intermediate amplifying stage means; and
   said plurality of output driver means supplying amplified signals having a 90 degree differential.

5. A quadrature hybrid according to claim 1 wherein each of said plurality of 90 degree phase shift means comprises:
   high pass filter means;
   low pass filter means;
   input means;
   said high pass filter means and said low pass filter means coupled to said input means;
   said high pass means coupled to said first output; and
   said low pass means coupled to said second output.

6. A quadrature hybrid comprising:
   a plurality of quadrature phase shifters, each of said plurality of quadrature phase shifters having a plurality of outputs;
   each of said plurality of quadrature phase shifters receiving an input signal and supplying a plurality of output signals having a 90 degree phase differential with respect to each other;
   a plurality of in-phase combiners;
   a first of said plurality of outputs of each of said plurality of quadrature phase shifters coupled to a first of said in-phase combiners to relay a first of said plurality of output signals;

a second of said outputs of each of said plurality of quadrature phase shifters coupled to a second of said in-phase combiners to relay a second of said plurality of output signals; and said plurality of in-phase combiners outputting a plurality of output signals having a 90 degree differential.

7. A quadrature hybrid according to claim 6 wherein said plurality of quadrature phase shifters comprise:

high pass filter;

low pass filter;

input;

said high pass filter and said low pass filter coupled to said input;

said high pass filter coupled to said first of said plurality of outputs; and said low pass filter coupled to said second of said plurality of outputs.

8. A quadrature hybrid according to claim 6 wherein the hybrid further comprises:

a plurality of input amplifiers; and one each of said input amplifiers coupled to one each of said plurality of quadrature phase shifters.

9. A quadrature hybrid according to claim 6 wherein the hybrid further comprises:

plurality of amplifying means;

one each of said plurality of amplifying means coupled to one each of said plurality of in-phase combiners to receive said plurality of output signals; and said plurality of amplifying means for supplying gain to said plurality of output signals.

10. A quadrature hybrid according to claim 9 wherein each of said plurality of amplifying means comprise:

a plurality of input amplifying stage means for amplifying said output signals from said plurality of in-phase combiners;

a first of said plurality of input amplifying means coupled to said first output of each of said plurality of in-phase combiners to receive said first of said plurality of output signals;

a second of said plurality of input amplifying means coupled to said second output of each of said plurality of 90 degree phase shift means to receive said second of said plurality of output signals;

each of said plurality of input amplifying stage means combining the respective received output signals;

a plurality of intermediate amplifying stage means;

one each of said intermediate amplifying stage means coupled to said one each of said input amplifying stage means to receive said amplified, combined output therefrom;

said intermediate amplifying stage means for amplifying said amplified, combined outputs;

a plurality of output driver means, one each of said output driver means coupled to one each of said intermediate amplifying stage means to receive an amplified output therefrom;

said plurality of output driver means for amplifying said outputs from said plurality of intermediate amplifying stage means; and said plurality of output driver means supplying amplified signals having a 90 degree phase differential.

* * * * *

UNITED STATES PATENT AND TRADEMARK OFFICE
CERTIFICATE OF CORRECTION

PATENT NO. : 4,914,728

DATED : April 3, 1990

INVENTOR(S) : Craig L. Fullerton

It is certified that error appears in the above-identified patent and that said Letters Patent is hereby corrected as shown below:

In column 4, claim 4, line 46, after the word "degree" insert --phase--.

In column 5, claim 6, line 8, after the word "degree" insert --phase--.

Signed and Sealed this

Twenty-seventh Day of August, 1991

Attest:

HARRY F. MANBECK, JR.

Attesting Officer

Commissioner of Patents and Trademarks